United States Patent

Seyama

[11] Patent Number: 6,163,159
[45] Date of Patent: Dec. 19, 2000

[54] CHARGED PARTICLE BEAM TEST SYSTEM

[75] Inventor: Masahiro Seyama, Meiwa-mura, Japan

[73] Assignee: Advantest Corp, Tokyo, Japan

[21] Appl. No.: 09/083,003

[22] Filed: May 21, 1998

[30] Foreign Application Priority Data

Jun. 2, 1997 [JP] Japan ................................. 9-143801

[51] Int. Cl.[7] ............................................. G01R 31/305
[52] U.S. Cl. ........................ 324/751; 324/753; 250/310
[58] Field of Search ................................. 324/751, 753,
324/73.1, 158.1, 752, 765; 250/310, 311,
306, 492.2; 355/53, 72, 43

[56] References Cited

U.S. PATENT DOCUMENTS

| 4,843,330 | 6/1989 | Golladay et al. | 324/751 |
| 4,980,639 | 12/1990 | Yoshizawa et al. | 324/751 |
| 5,546,011 | 8/1996 | Takahashi et al. | 324/753 |

*Primary Examiner*—Safet Metjahic
*Assistant Examiner*—Minh Tang
*Attorney, Agent, or Firm*—Muramatsu & Associates

[57] ABSTRACT

A charged particle beam test system has improved voltage measurement accuracy when irradiating a charged particle beam upon predetermined portion of a device under test (DUT) and detecting secondary electron detected therefrom representing a voltage of the irradiated portion of the DUT. The test system includes a DUT driver for supplying a test signal to the DUT to cause the voltage at the irradiated portion and generating a trigger signal, a sampling pulse generator for continuously generating a sampling pulse having a predetermined time interval to drive the charged particle beam, a time difference detector for detecting a time difference between the trigger signal and the sampling pulse, an address data generator for generating address data corresponding to the time difference, and a test result memory for storing measured data representing an amount of the secondary electron emitted from the irradiation portion of the DUT in addresses specified by the address.

7 Claims, 11 Drawing Sheets

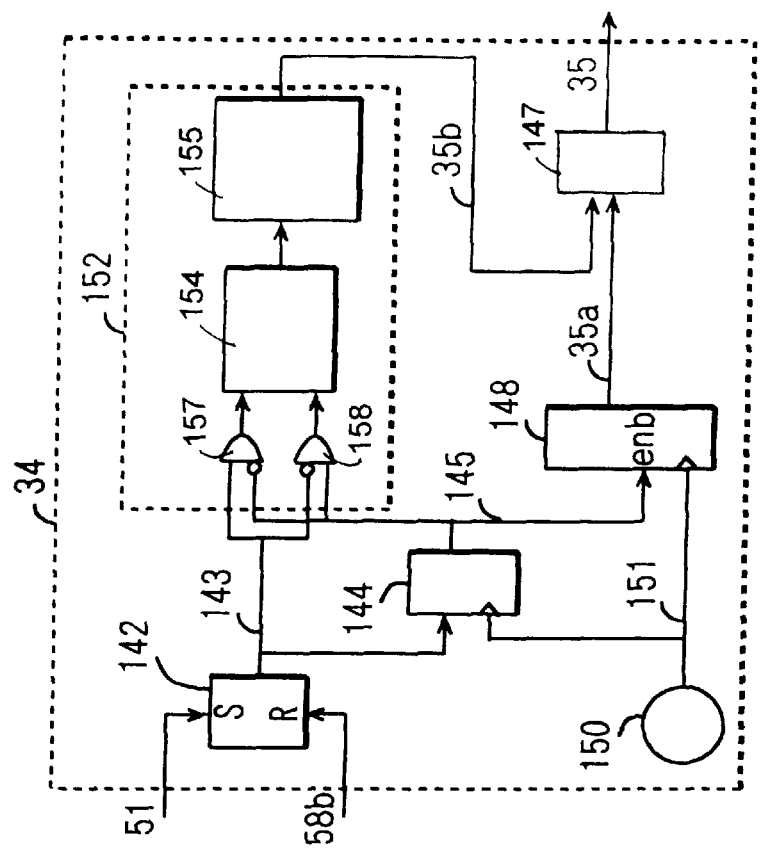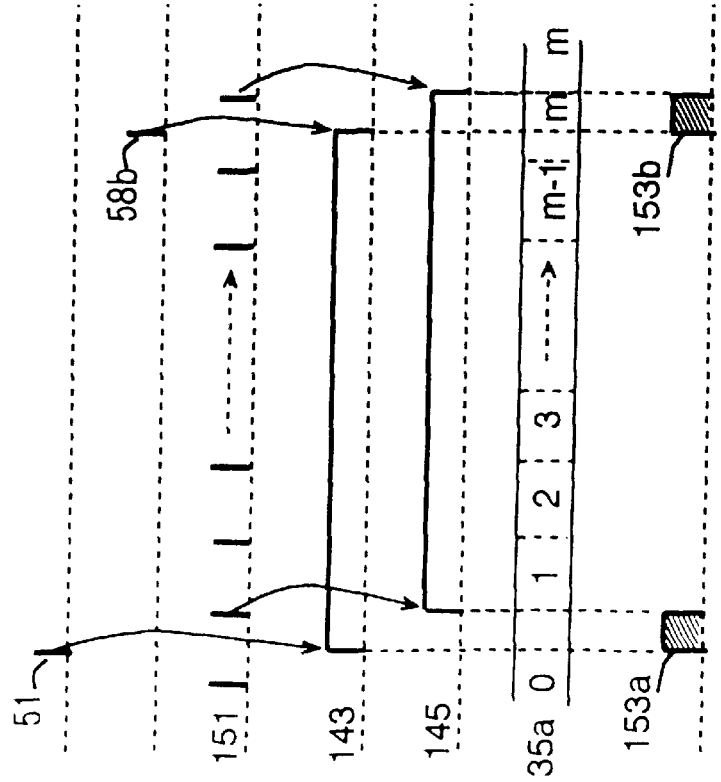
Fig.2C
Fig.2B

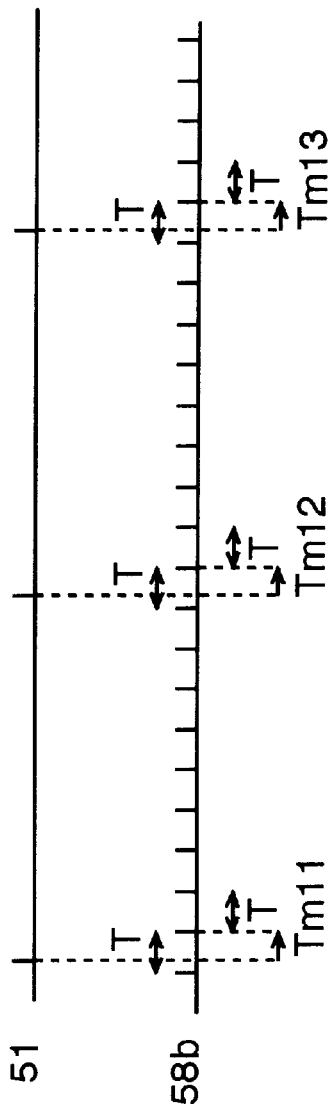
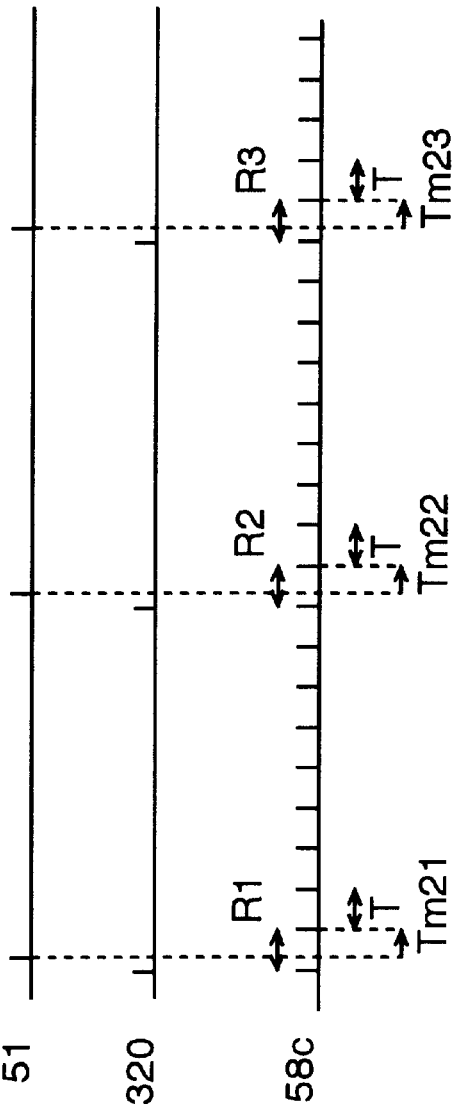

CHARGED PARTICLE BEAM TEST SYSTEM

FIELD OF THE INVENTION

This invention relates to a charged particle beam test system for testing an electronics circuit, and more particularly, to a charge particle beam test system for testing a semiconductor integrated circuit by sampling electric potentials on a surface of the integrated circuit with improved accuracy and efficiency.

BACKGROUND OF THE INVENTION

As one of the methods for testing semiconductor devices such as a very large scale integrated circuit (VLSI), a charged particle beam test system may be used to monitor voltages in internal nodes of the VLSI. A charged particle beam, such as an electron beam, is irradiated onto the surface of an integrated circuit under test (DUT) and the resultant secondary electron which represents the voltages and other states of the DUT is detected, thereby obtaining a voltage contrast image of the DUT on a display. A charged particle beam test system is advantageous for testing a high density and complex semiconductor chip because it can test such semiconductor chips without physically contacting thereto for probing input/output signals.

In a type of charged particle beam test systems, the secondary electron from DUT resulted by irradiation of the charged beam is sampled in a predetermined time sequence. An example of such a charged particle beam test system in the conventional technology is shown in FIGS. 5 and 6. In the example of FIG. 5, the charged particle beam test system includes a DUT driver 40, a burst sampling signal generator 50, a charged particle beam column 60, a signal processor 70, a test result memory 80, and a controller 90. The charged particle beam column 60 includes a charged particle beam generator such as an electron gun 62, a beam blanker 64, an X-Y beam deflector 65, a grid 66 and a secondary electron detector 68. At the bottom of the column 60, a semiconductor device under test (DUT) is placed on an X-Y stage 67. The burst sampling signal generator 50 includes a variable delay 52 and a burst pulse generator 54.

A charged particle beam such as an electron beam emitted from the electron gun 62 is irradiated on the surface of the DUT through the beam blanker 64 and the beam deflector 65. The beam blanker 64 controls blanking of the charged particle beam from the electron gun 62 thereby producing a pulsed charged particle beam. The beam deflector 65 deflects the charged particle beam from the electron gun 62 thereby allowing the beam to scan on the DUT. By moving the X-Y stage 67 in the X and Y directions, the irradiating position of the charged particle beam on the surface of the DUT can be controlled. The signal processor 70 provides a control signal which is provided to the grid 66 to control the amount of secondary electron emitted from the DUT. Such functions of the X-Y stage 67 and the grid 66 are not directly related to the point of the present invention.

The DUT driver 40 provides test signals 48 with predetermined timings to corresponding terminals of the DUT so that the circuit to be tested by the charged-particle beam be active. The DUT driver 40 also provides a trigger signal 51 to the burst sampling signal generator 50 to synchronize the test signals 48 to the DUT and the pulsed charged particle beam irradiated on the DUT. Typically, the DUT driver 40 is an IC tester which generates test patterns with various timings based on a software program.

Because the charged particle beam column 60 is relatively slow in its operational speed, a sampling method is used in testing the potential data of the DUT in high timing resolution. In this example, the burst sampling signal generator 50 provides N pulses to the beam blanker 64 for each trigger signal 51 from the DUT driver 40 to decrease the measuring time by 1/N. The burst sampling pulses have a time interval T which is large enough for the charge particle beam column 60 to respond.

Moreover, to acquire the test result data in high timing resolution, the start timing of such sampling pulses is made random or slightly shifted for each trigger signal. In this example, the burst sampling signal generator 50 is arranged to generate N burst pulses 58 every time when the trigger pulse 51 is received from the DUT driver 40. The start timing of the burst pulses, i.e., the time difference between the trigger signal and the first burst pulse is varied randomly or slightly for each set of burst pulses 58. The burst pulses 58 has a predetermined time period T and are produced by the burst pulse generator 54 at the randomly delayed or slightly shifted time after the trigger pulse 51 by the variable delay 52.

The operation of the burst sampling signal generator 50 is shown in FIG. 6A. The trigger pulse 51 to the sampling pulse generator 50 is generated in synchronism with the test signal 48 to the DUT. After the delay time Td specified by the variable delay 52, the first set of burst pulses 58 is generated by the burst pulse generator 54. The number of burst pulses is N and the burst pulses have the predetermined time interval T as shown in FIG. 6A.

In the example of FIG. 6A, each set of burst pulses starts by adding a delay time $\Delta T$ to the delay time Td by the variable delay 52. Namely, the first set of burst pulses 58 is generated at the first delay time Td relative to the trigger pulse 51. The second set of burst pulses 58 is generated after a second delay time Td+$\Delta T$ produced by the variable delay 52 relative to the second trigger pulse 51 pulse. The third set of burst pulses 58 is generated after a third delay time Td+2$\Delta T$ produced by the variable delay 52 relative to the third trigger pulse 51. Similarly, the N-th set of burst pulses 58 is started after an N-th delay time Td+N$\Delta T$ delayed from the N-th trigger pulse 51.

Each set of burst pulses 58 is applied to the beam blanker 64 of the charged particle beam column 60 so that the charged particle beam is irradiated in the form of the burst pulses. The burst sampling signal generator 50 also provides sampling pulse data 59a and address data 59b to the signal processor 70. The address data 59b shows address information relative to the timing of the trigger pulse 51 as shown in FIG. 6B. The signal processor 70 provides the address data to the test result memory 80 to store the test data therein representing the secondary electron responsive to the burst pulses. The sampling pulse data 59a may include the information on the type of data followed.

In the example of FIG. 6B, for the first pulse of the first set of burst pulses 58, the address data 59b for accessing the address "0" of the memory 80 is produced based on the trigger pulse 51 at the timing suitable to store the measured data corresponding to the first pulse. Further in this example, it is so arranged that after the time interval T, the address data 59b for accessing the address "8" is provided to the memory 80 through the signal processor 70 to store the measured data corresponding to the second pulse of the first burst pulses. In this manner, the address data for accessing every eight addresses is produced in the first set of burst pulses 58.

In the second set of burst pulses, the address data 59b is produced for accessing the address "1" at the time corresponding to an additional delay time ΔT for storing the measured data corresponding to the first pulse of the second set of burst pulses. After the time interval T, the address data 59b for accessing the address "9" is provided to the memory 8 to store therein the measured data corresponding to the second pulse. In this manner, the address data for accessing every eight address is produced in the second set of burst pulses 58 at the timing shifted by the delay time ΔT relative to the first set of burst pulses. The above noted process is repeated so that all of the memory addresses are filled with the measured data when the last set of burst pulses has been generated.

Since the burst pulses 58 are applied to the beam blanker 64 of the charged particle beam column 60 in the manner noted above, the charged particle beam is irradiated on the DUT in the form of the burst pulses. The portion of the DUT which is irradiated with the charged particle beam emits secondary electron representing the voltage in the irradiated portion. The secondary electron detector 68 detects the secondary electron from the DUT to obtain the waveforms as shown in FIG. 7A and integrates the detected signal in a manner shown in FIG. 7B. The secondary electron detector 68 converts the detected signal to digital data 69 which is provided to the signal processor 70 as shown in FIG. 5.

The waveforms of FIGS. 7A and 7B show the case where the charged particle beam from the electron gun 62 is not swept by the X-Y deflector 65 but fixedly irradiating the specified position on the DUT. Further, the waveforms of FIGS. 7A and 7B show the case where the voltage in the irradiated node of the DUT is a fixed DC voltage which is in a steady state rather than a transitional state. After testing the specified position of the DUT in the manner noted above, the charged particle beam is deflected by the X-Y deflector 65 to irradiate the next position on the DUT to measure the secondary electron emitted therefrom.

In receiving the detected data 69 from the secondary electron detector 68 as well as the sampling pulse data 59a and the address data 59b, the signal processor 70 processes and converts the detected data 69 to test result data 79. The signal processor 70 sends the test result data 79 and address data 78 which is basically the same as the address data 59b to the test result memory 80. Based on the data from the signal processor 70, the test result memory 80 stores the test result in the addresses specified in the manner shown in FIG. 6B.

In this manner, the test results are stored in the addresses of the memory 80 corresponding to the N burst pulses having the time interval T with one another. The time length between the trigger pulse 51 and the start of the burst pulses increases by the delay time ΔT relative to the previous set of burst pulses as noted above with reference to FIGS. 6A and 6B. Namely, the delay time ΔT corresponds to the timing difference between the two adjacent addresses of the memory 80. Thus, by repeating the predetermined sets of burst pulses, all of the test results will be stored in the corresponding addresses of the test result memory 80.

In this conventional technology, however, there arises a transient voltage error for at least first several burst pulses every time the set of burst pulses are applied to the DUT. Such a transient voltage error is illustrated in FIGS. 7A and 7B. In FIG. 7A, even when the DC voltage in the irradiated node of the DUT is a constant value, the amount of secondary electron detected by the secondary electron detector 68 varies with respect to the first several burst pulses. Thus, when the peak values of the detected voltage are integrated, the waveform of FIG. 7B showing the average voltage will be produced which is a curved or stepped line rather than a straight line.

This transient voltage error is considered to be caused by the temperature change of the charged particle beam test system or a time constant involving stray capacitors in the charged particle beam test system. Since the system is not operating during the period after the end of the previous burst pulses and before the start of the next burst pulse, such changes in the temperature may occur for the first several pulses in the set of burst pulses. Further, since the system has a period when it is not generating the charged particle beam and other period when the charged particle beam in the burst pulse form is generated, there exists a transient period caused by the stray capacitors in the system.

As a consequence, the conventional test method using the burst pulses involves the transient voltage error such as shown in FIGS. 7A and 7B. Therefore, the conventional charged particle beam test system is not appropriate for evaluating the potential contrast of the LSI which requires high measurement accuracy.

SUMMARY OF THE INVENTION

Therefore, it is an object of the present invention to provide a charged particle beam test system which is capable of acquiring large number of sampled data from a device under test (DUT) with high accuracy.

It is another object of the present invention to provide a charged particle beam test system which is capable of removing the error caused by discontinuously driving the charge particle beam when detecting the secondary electron from the irradiated portion of the DUT.

It is a further object of the present invention to provide a charged particle beam test system which can efficiently acquire test results corresponding to predetermined addresses of a test result memory within a short period of time.

It is a further object of the present invention to provide a charged particle beam test system which is able to eliminate the voltage error by continuously applying the pulsed beam on the DUT for sampling the secondary electron emitted therefrom and storing the test results in the predetermined timings relative to the trigger signal.

In the present invention, the charged particle beam test system for irradiating a charged particle beam upon predetermined portion of a device under test (DUT) and detecting secondary electron detected therefrom representing a voltage of the irradiated portion of the DUT includes a DUT driver for supplying a test signal to the DUT to cause the voltage at the irradiated portion and generating a trigger signal in synchronism with the test signal, a sampling pulse generator for continuously generating a sampling pulse having a predetermined time interval to drive the charged particle beam so that the secondary electron is emitted from the DUT in response to the sampling pulse, a time difference detector for detecting a time difference between the trigger signal from the DUT driver and the sampling pulse coming immediately after the trigger signal, an address data generator for generating address data corresponding to the time difference detected by the time difference detector, and a test result memory for storing measured data representing an amount of the secondary electron emitted from the irradiation portion of the DUT in addresses specified by the address data from the address generator.

According to the charged particle beam of the present invention, the charged particle beam is constantly applied to the DUT by the continuous sampling pulse throughout the test. The charged particle beam column does not involve the transition from the non-operation to operation. Therefore, the charged particle beam test system of the present invention can eliminate the voltage error during the transient stage involved in the conventional technology. Further, in the present invention, the charged particle beam test system can efficiently acquire the test results corresponding to the predetermined addresses of the test result memory with high timing resolution in a short period of time.

BRIEF DESCRIPTION OF THE DRAWINGS

FIGS. 2A and 2B are timing charts for explaining the operational timing for sampling and storing the test results in the memory and FIG. 2C is a block diagram showing a structure of the time difference detector circuit of the present invention.

FIG. 10 is a timing chart showing an operation of the sampling pulse generator of FIG. 8.

FIG. 11 is a timing chart showing an operation of the sampling pulse generator of FIG. 9.

DETAILED DESCRIPTION OF THE PREFERRED EMBODIMENTS

Figure 1:
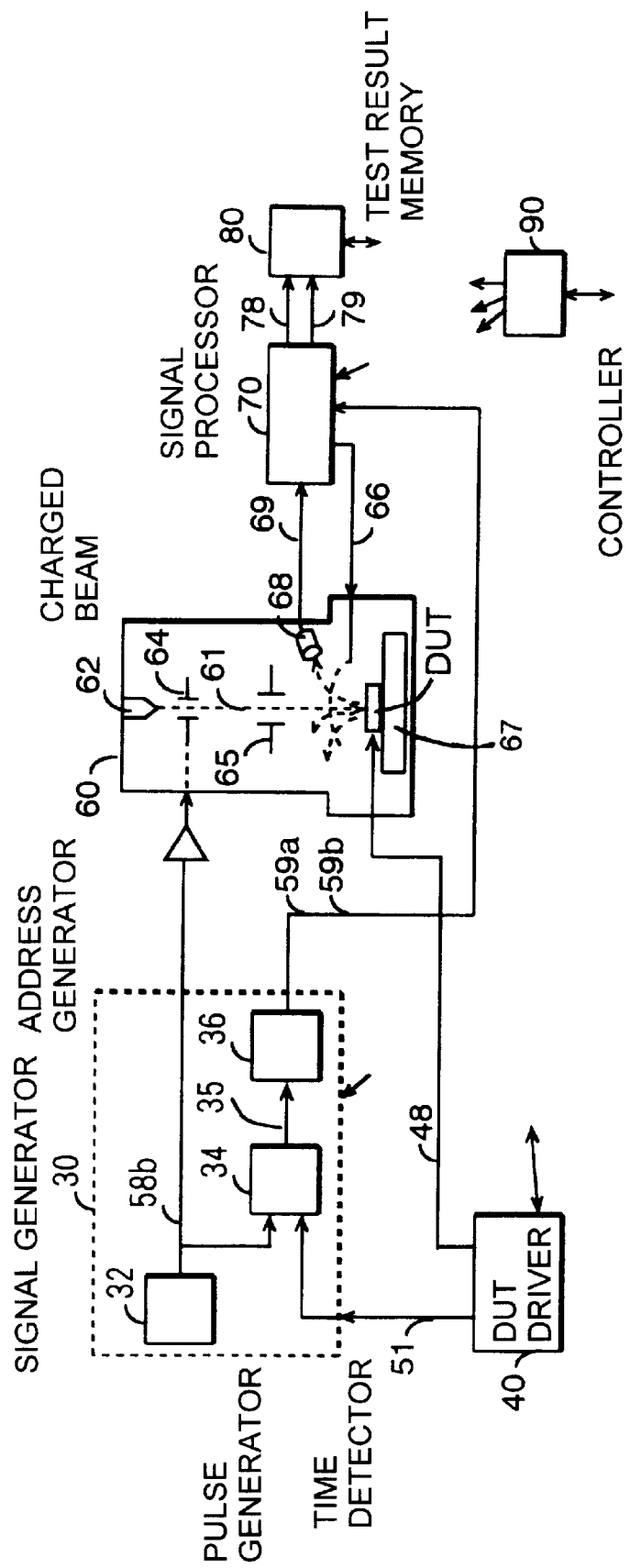
FIG. 1 is a schematic block diagram showing a structure of the charged particle beam test system in the first embodiment of the present invention.
Figure 2A:
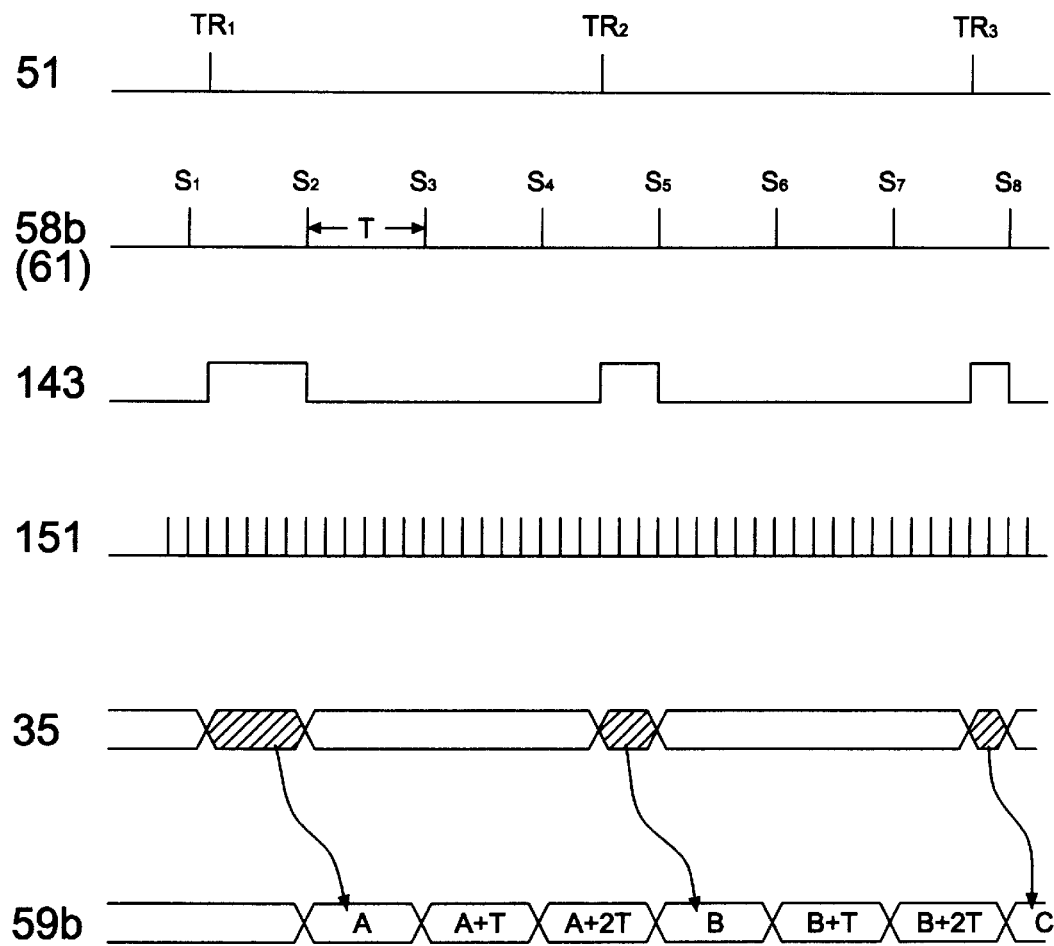

A first embodiment of the present invention is explained with reference to FIGS. 1 and 2. FIG. 1 is a schematic block diagram showing a structure of the charged particle beam test system in the first embodiment of the present invention. FIGS. 2A and 2B are timing charts for explaining the operational timing for sampling and storing the test results in the memory. FIG. 2C is a block diagram showing a structure of the time difference detector circuit of the present invention. In FIGS. 1 and 2, the same reference numerals as used in the conventional example of FIGS. 5 and 6 designate the same elements.

The charged particle beam test system of the present invention includes a DUT driver 40, a continuous sampling signal generator 30, a charged particle beam column 60, a signal processor 70, a test result memory 80, and a controller 90. Basic difference from the conventional example resides in the function and structure of the continuous sampling signal generator 30 as well as the operational timings in storing the test result data.

In this example, it is assumed that sampling pulses 58b to drive the charged particle beam column 60 and the trigger signal 51 from the DUT driver 40 operate asynchronously with one another. It is also assumed that the test result memory 80 can be accessed fast enough to respond to the address signals whose generation speed is substantially faster than the repetition rate of the sampling pulse 58b. Since the charged particle beam column 60 is slower in its operational speed than other portion of the test system, the data sampling method is employed in the present invention as in the same manner in the conventional technology.

Figure 5:
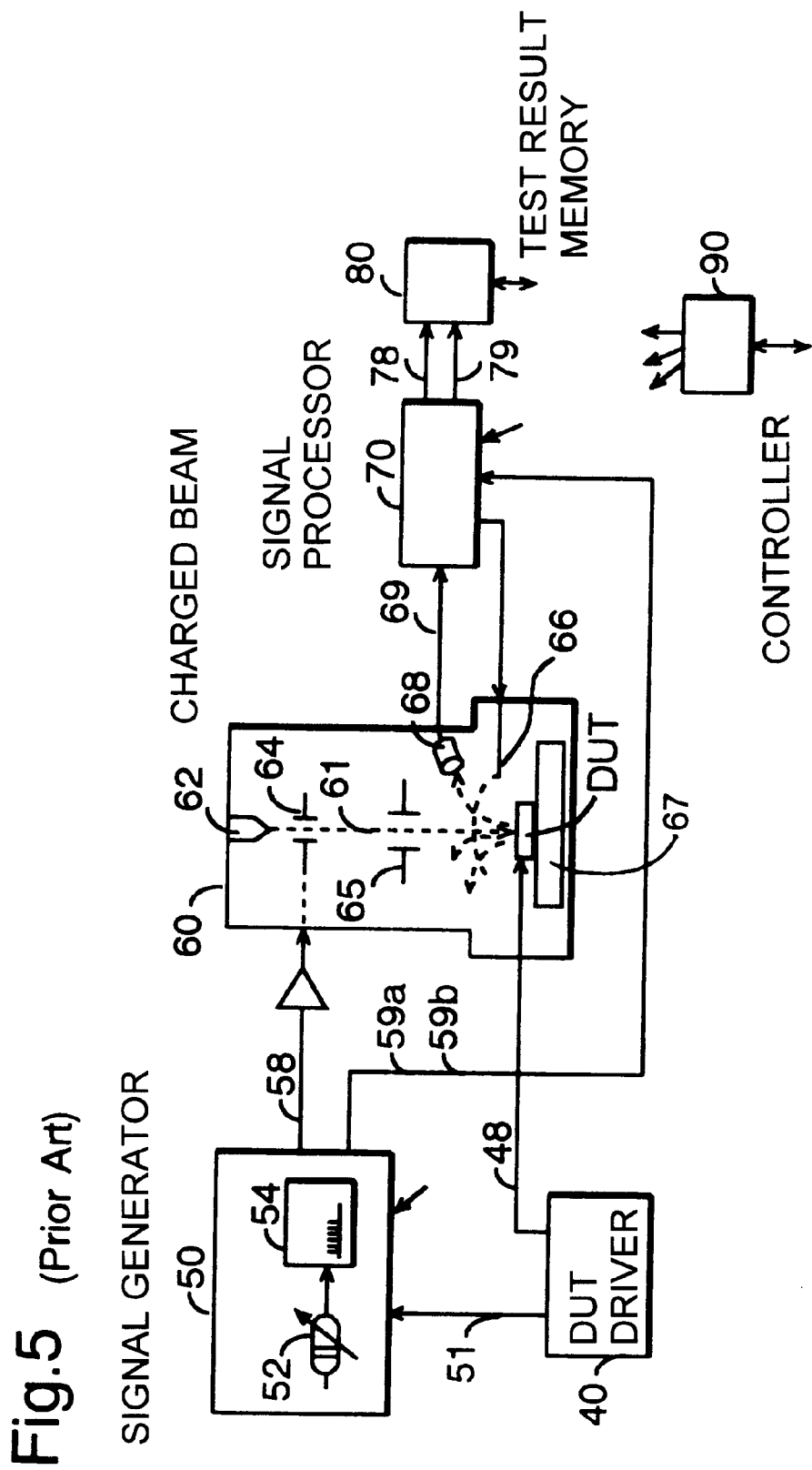
FIG. 5 is a schematic block diagram showing a structure of the charged particle beam test system using the burst sampling pulses in the conventional technology.
Figure 6A:
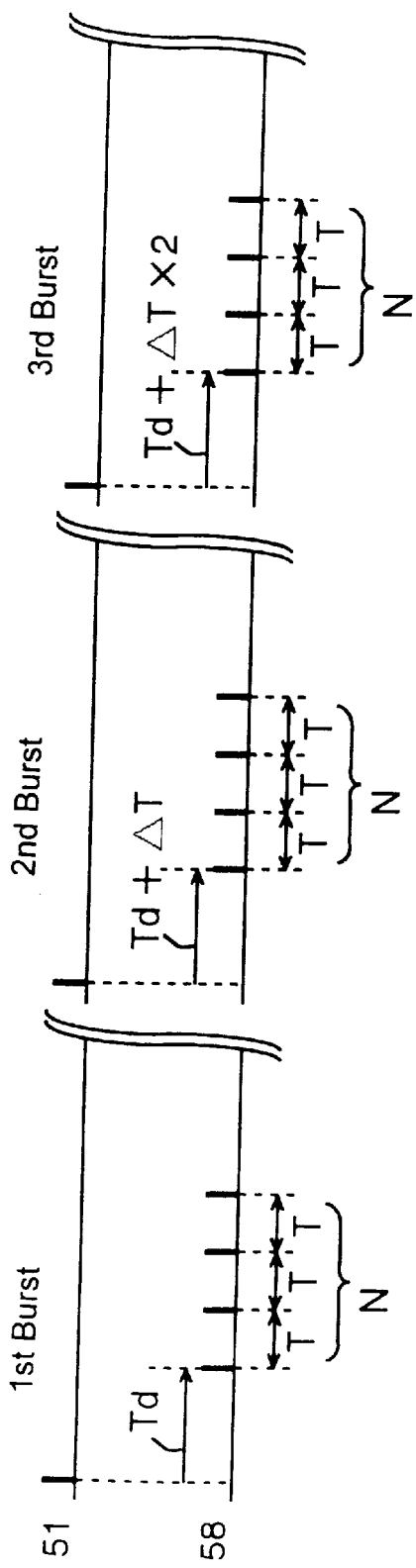
FIGS. 6A and 6B are timing charts showing the operational timing for sampling and storing the test results in the memory in the conventional charged particle beam test system of FIG. 5.
Figure 6B:
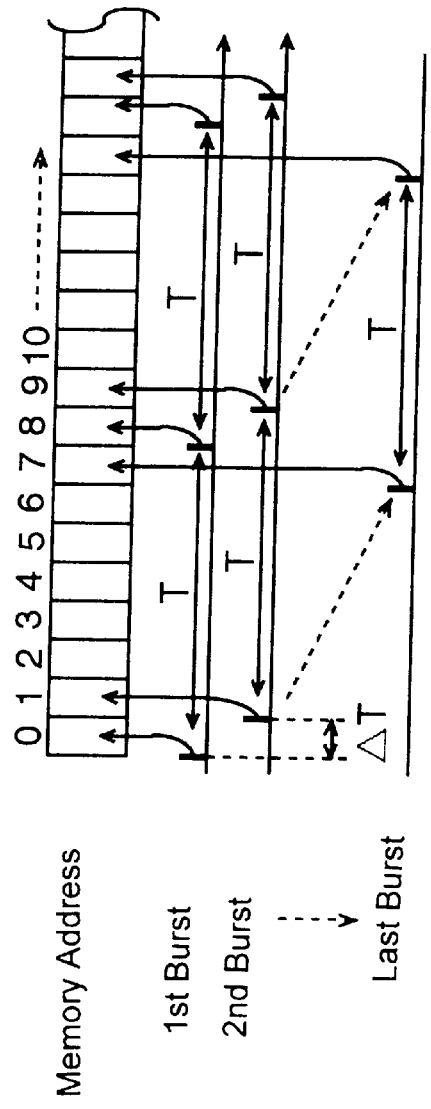

Similar to the example of FIG. 5, the charged beam column 60 includes a charged particle beam generator such as an electron gun 62, a beam blanker 64, an X-Y beam deflector 65, a grid 66 and a secondary electron detector 68. At the bottom of the column 60, a semiconductor device under test (DUT) is placed on an X-Y stage 67.

The continuous sampling signal generator 30 continuously supplies a sampling pulse 58b having a time interval T to the beam blanker 64. Consequently, the pulsed charged particle beam 61 is continuously irradiated on the specified position on the DUT. When receiving the trigger signal from the DUT driver 40, the sampling signal generator 30 determines the time difference between the trigger signal 51 and the sampling pulse 58b immediately after the trigger signal 51. Address data 59b which corresponds to the time difference is produced by the sampling signal generator 30 to store the measured data in the address of the test result memory 80 specified by the address data 59b.

Preferably, in generating the address data 59b, the first address of the memory 80 is produced based on the time difference noted above, and the following addresses are produced corresponding to every time interval T. This process of generating the address data 59b is repeated for each trigger signal 51 from the DUT driver 40.

Figure 7A:
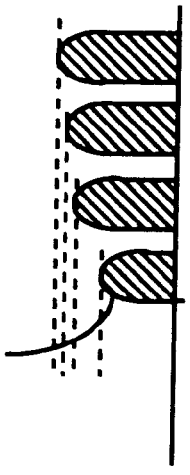
FIG. 7A is a schematic diagram showing waveforms detected by the secondary electron detector in the conventional test system of FIG. 5
Figure 7B:
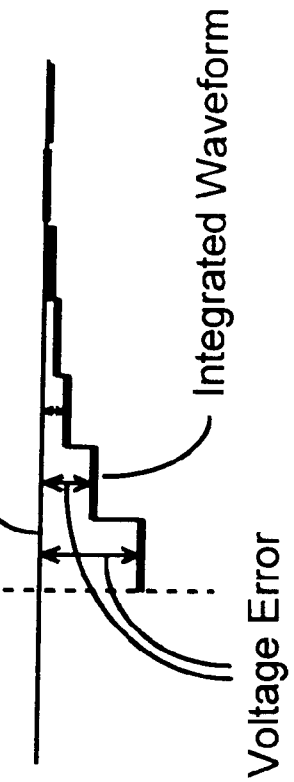
FIG. 7B is a schematic diagram showing voltage errors involved in the conventional technology.

As shown in FIG. 1, an example of structure in the continuous sampling signal generator 30 includes a pulse generator 32, a time difference detector 34 and a memory address generator 36. The pulse generator 32 continuously generates the sampling pulse 58b having the predetermined time interval T which is provided to the beam blanker 64. Thus, the charged particle beam column 60 generates the pulsed beam 61 continuously under the same condition which irradiates the specified position on the DUT. Since there is no change in the operation of the charged particle beam column 60 such as from the non-operating state to the operating state, the voltage error shown in FIGS. 7A and 7B involved in such changes will not occur in the present invention.

FIG. 2A shows a timing relationship between the trigger signal 51 and the sampling pulse 58b, i.e, the charged particle beam generated by the column 60 as well as the address data responsive to the timing relationship. The signal 143 shows the time difference between the trigger signal 51 and the sampling pulse 58b immediately after the trigger signal 51. The time difference data 35 is produced by measuring the time difference 143 with the use of a clock signal 151. The timings in FIG. 2A will be explained in more detail later.

As noted above, the time difference detector 34 detects the time difference between the trigger signal 51 from the DUT driver 40 and the sampling pulse 58b immediately after the trigger signal 51. The address data 59b which corresponds to the time difference data 35 is produced by the memory address generator 36 as will be described in more detail later.

FIG. 2C shows an example of structure in the time difference detector 34. In the example of FIG. 2C, the time difference detector 34 includes a set/reset (RS) flip-flop 142, a flip-flop 144, a clock generator 150, a clock counter 148, an adder 147, and a fractional time measuring circuit 152. The flip-flop 144 and the clock counter 148 produce time difference data 35a which is integer multiple of the period of the clock signal 151. The fractional time measuring circuit 152 produces time difference data 35b which is smaller than one period of the clock signal 151. The time difference data 35a and 35b are combined by the adder 147 to produce the data 35 which is provided to the address generator 36. The fractional time measuring circuit 152 in this example includes AND gates 157 and 158, a pulse width integrator 154, and an A/D converter 155.

FIG. 2B shows the operation of the time difference detector 34 of FIG. 2C. The clock generator 150 provides the clock signal 151 whose frequency is, for example 1 GHz, i.e., 1 ns (nanosecond) period, to the flip-flop 144 and clock counter 148. The RS flip-flop 142 in FIG. 2C is set by the trigger signal 51 and is reset by the sampling pulse 58b coming immediately after the trigger signal 51 to produce the time difference signal 143 of FIGS. 2A and 2B. The time difference signal 143 is provided to the AND gates 157 and 158. The flip-flop 144 receives the time difference signal 143 and the clock signal 151 to produce a clock synchronized time difference signal 145 shown in FIG. 2B. The clock synchronized time difference signal 145 is provided to the AND gates 157 and 158 as well as to the clock counter 148. During the period of the time difference signal 145, the clock counter 148 counts the number of clock signal 151 and produces the time difference data 35a which indicates a time length of an integer multiple of the clock period.

When receiving the time difference signals 143 and 145, the AND gates 157 and 158 respectively produce the fractional time differences 153a and 153b which are smaller than the clock time period as shown in FIGS. 2B and 2C. The fractional time measuring circuit 152 is to measure the time differences 153a and 153b with high resolution by converting the pulse widths to corresponding analog voltages by the pulse width integrator 154. The difference between the two analog voltages is converted to a digital signal indicating the time difference data 35b by the A/D converter 155. As shown in FIG. 2B, the true time difference between the trigger signal 51 and the sampling pulse 58b is the sum of the time difference data 35a and the fractional time difference data 35b. Thus, as in FIG. 2C, the adder 147 combines the data and provides the resultant time difference data 35 which shows the true time difference and is received by the memory address generator 36.

The memory address generator 36 generates the address data 59b which corresponds to the time difference data 35 to access the test result memory 80 through the signal processor 70. As noted above, it is assumed that the test result memory 80 can be accessed fast enough to respond to the time difference indicated in the time difference data 35.

Thus, in FIG. 2A, in response to the data 35 indicating the time difference between the first trigger $TR_1$ and the sampling pulse $S_2$, the address data 59b generated by the address generator 36 shows an address "A" which corresponds to the first time difference data 35. The address "A" includes the timing resolution much higher than the time interval T of the sampling pulses 58b. For the next sampling pulse $S_3$, the address generator 36 produces the address "A+T" where T is the time interval of the sampling pulse 58. For the further next sampling pulse $S_4$, the address generator produces the address "A+2T".

For the next trigger pulse $TR_2$, in response to the data 35 indicating the time difference between the second trigger $TR_2$ and the following sampling pulse $S_5$, the address generator 36 produces the address data 59b showing an address "B". For the next sampling pulse $S_6$, the address generator 36 produces the address "B+T". For the further next sampling pulse $S_7$, the address generator produces the address "B+2T". This process of generating the address data 59b is repeated for each trigger pulse 51 from the DUT driver 40.

In receiving the detected data 69 from the secondary electron detector 68 as well as the sampling pulse data 59a and the address data 59b, the signal processor 70 processes and converts the detected data 69 to test result data 79. The signal processor 70 sends the test result data 79 and address data 78 (address data 59b) to the test result memory 80. Based on the data from the signal processor 70, the test result memory 80 stores the test result in the addresses specified by the address data. Since the timing between the trigger signal and the sampling pulses are asynchronous, by repeating the above operations, the test result data will be fully stored in the test result memory 80.

Figure 8:
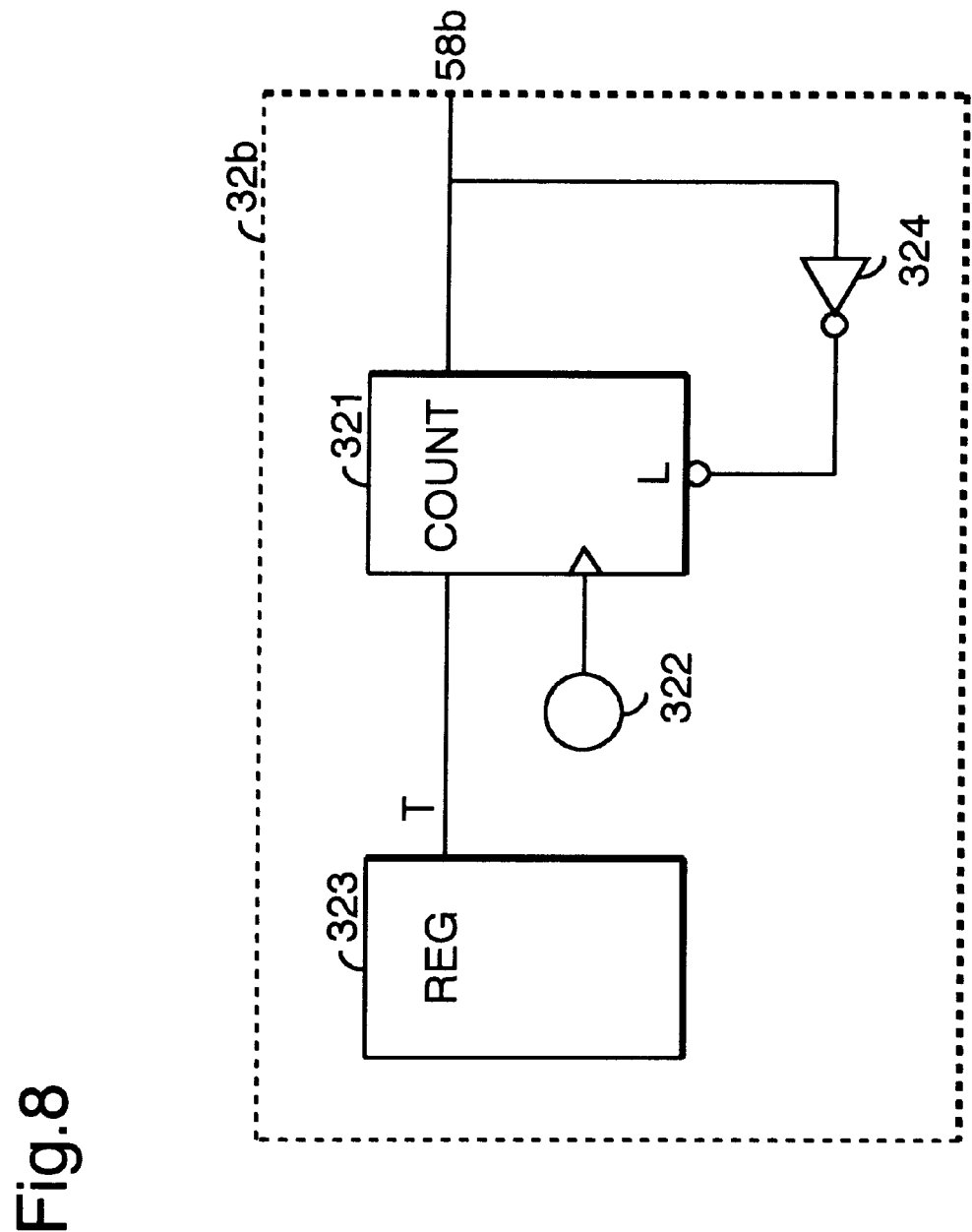
FIG. 8 is a block diagram showing an example of sampling pulse generator in the charged particle beam test system of the present invention.

FIG. 8 shows an example of sampling pulse generator 32b in FIG. 1. A counter 321 counts the number of clock pulses from a clock generator 322 until the counted number reaches the value specified by a register 323. The value specified by the register 323 determines the time interval T of the sampling pulse 58b. When the counted number reaches the value from the register 323, the counter generates an output pulse as the sampling pulse 58b. The output pulse also returns through a buffer 324 to load the value from the register 323 to the counter 321 so that the counter starts counting the pulse again. By repeating this process, the sampling pulse generator 32b generates the sampling pulse 58b having the predetermined time interval T.

FIG. 10 is a timing chart showing a timing relationship between the sampling pulses generated by the sampling pulse generator 32b and the trigger signal generated by the DUT driver 40. The sampling pulse 58b having the time interval T is continuously generated by the pulse generator 32b such as shown in FIG. 8. The sampling pulse 58b is asynchronous with the trigger signal 51. Thus, the time difference between the trigger signal 51 and the sampling pulse 58 immediately after the trigger signal 51 varies in a random manner. Such time difference is shown in FIG. 10 as $Tm_{11}$, $Tm_{12}$ and $Tm_{13}$ as well as in FIG. 2A (output 143 of RS flip-flop 142 or time difference data 35).

As noted above, since the time difference between the trigger signal 51 and the sampling pulse 58b varies randomly, by repeating the above operations of generating the address data storing the corresponding measured data, overall data with the desired time resolution will be acquired in the test result memory 80. The signal processor 70 detects the completion of the data acquisition and sends a detection signal to the controller 90 to end the measurement on the specified position on the DUT. During this process, the same address data may be generated more than twice, resulting in a small redundancy in the measurement time and data.

Preferably, the signal processor 70 further includes means for monitoring the random nature of the time difference between the trigger signal and the sampling pulse. This may be achieved by counting the number of same address data produced by the address generator 36. If it is determined that the random nature is degraded, i.e., the number of same address generation is larger than the appropriate value, the time interval T of the sampling pulse 58b may be slightly adjusted through the controller 90. Thus, the random nature of the address data generation, i.e., the difference between the trigger signal and the sampling pulse can be maintained throughout the measurement.

According to the first embodiment of the present invention, the charged particle beam 61 is constantly generated by the continuous sampling pulse 58b throughout the test. In other words, the charged particle beam column 60 does not involve the transition from the non-operation to operation experienced in the conventional technology using the burst sampling pulse. Therefore, the charged particle beam test system of the present invention can eliminate the voltage error during the transient stage involved in the conventional technology of FIGS. 5–7.

Figure 3:
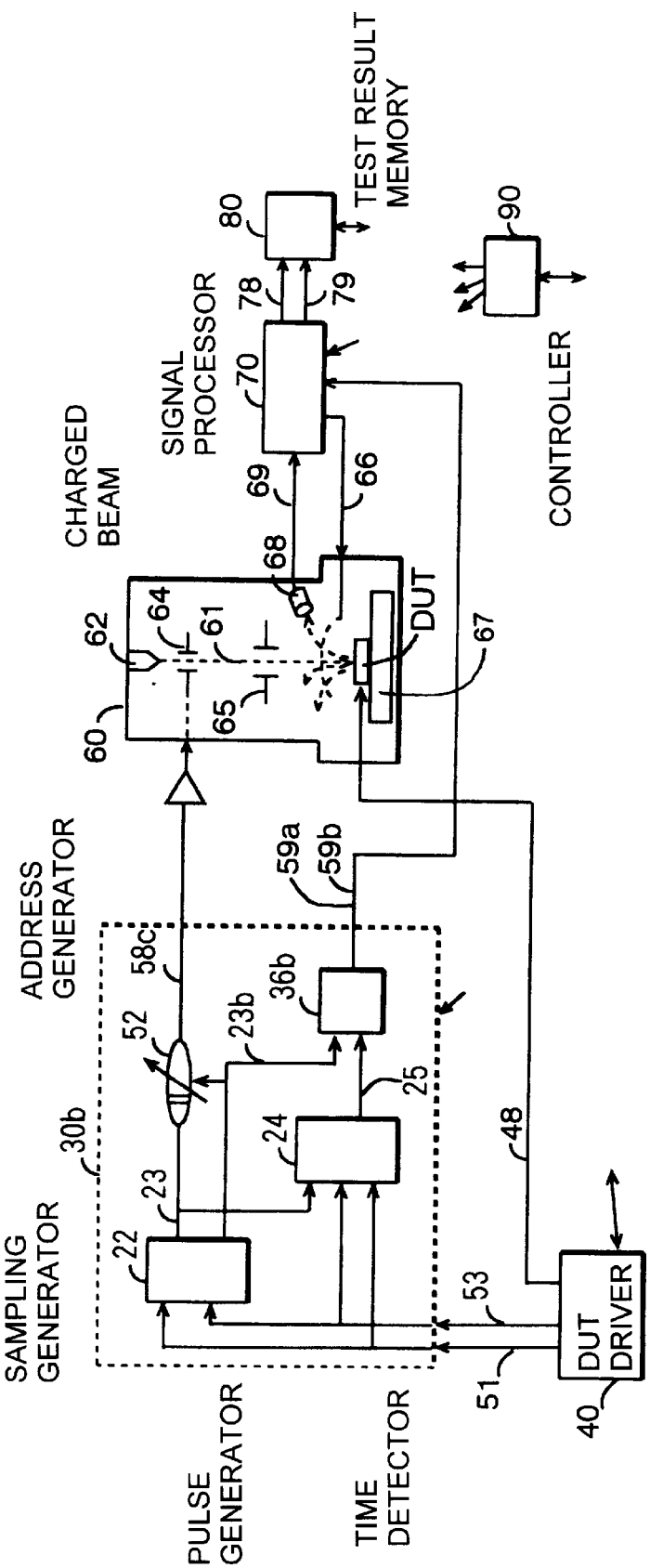
FIG. 3 is a schematic block diagram showing a structure of the charged particle beam test system in the second embodiment of the present invention.
Figure 4:
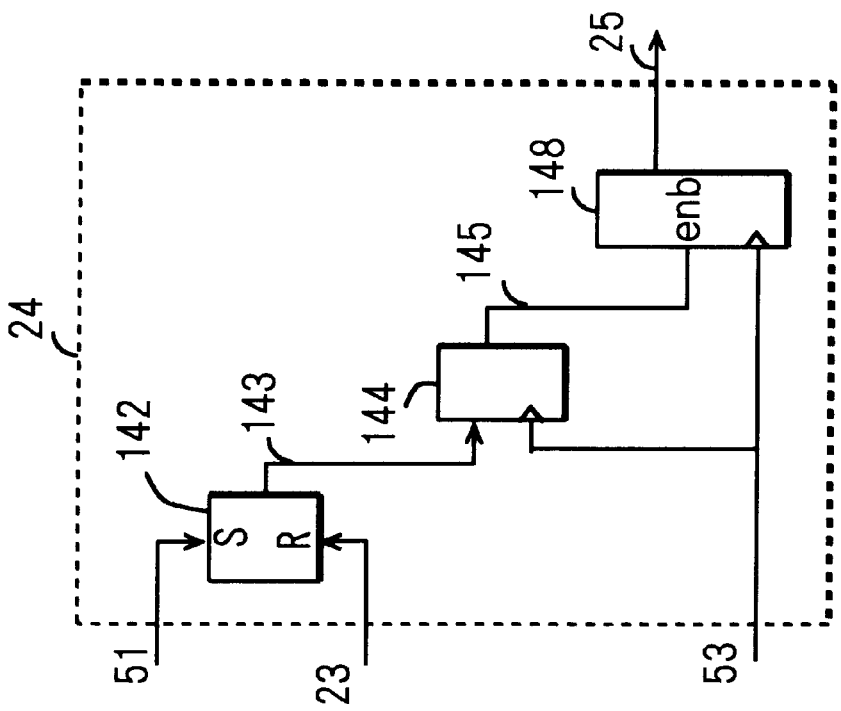
FIG. 4 is a block diagram showing a structure of the time difference detector circuit in the second embodiment of the present invention.

The second embodiment of the present invention is described with reference to FIGS. 3 and 4. FIG. 3 is a schematic block diagram showing a structure of the charged particle beam test system in the second embodiment and FIG. 4 is a block diagram showing a structure of the time difference detector circuit in the second embodiment.

The charged particle beam test system of the present invention includes a DUT driver 40, a synchronous sampling signal generator 30, a charged particle beam column 60, a signal processor 70, a test result memory 80, and a controller 90. Basic difference from the first embodiment of FIG. 1 resides in that the continuous sampling signal generator 30 is replaced with the synchronous sampling generator 30b. The synchronous sampling signal generator 30b generates a sampling pulse 58c in synchronism with a synchronous clock 53 from the DUT driver 40.

As in the first embodiment, the charged particle beam column 60 is slower in its operational speed than other portions of the test system. This means that the time interval T of the sampling pulse 58c for driving the charged particle beam 61 is substantially larger than the access time of the test result memory 80. Thus, in the similar manner to the conventional example, the timing between the sampling pulse and the trigger signal is shifted for each trigger signal so that the test result is stored in the memory with high timing resolution.

Similar to the example of FIG. 1, the charged particle beam column 60 includes a charged particle beam generator such as an electron gun 62, a beam blanker 64, an X-Y beam deflector 65, a grid 66 and a secondary electron detector 68. At the bottom of the column 60, a semiconductor device under test (DUT) is placed on an X-Y stage 67. The synchronous sampling signal generator 30 includes a pulse generator 22, a variable delay element 52, a time difference detector 24 and a memory address generator 36b. The trigger signal 51 and the synchronous clock 53 from the DUT driver 40 are provided to the sampling pulse generator 22 and the time difference detector 24, respectively.

The synchronous clock 53 is a clock having a frequency, for example, of several ten MHz which is generated by the DUT driver. The frequency of the synchronous clock 53 is known in advance by the signal processor 70 and the controller 90. The trigger signal 51 is synchronized with the synchronous clock 53, however, the generation timing varies depending on the test condition of the DUT or other factors.

In receiving the synchronous clock 53 from the DUT 40, the sampling pulse generator 22 generates a sampling pulse 23 having a predetermined time interval T. The sampling pulse 23 is synchronized with the synchronous clock 53 and is provided to the variable delay element 52 and the time difference detector 24. In this example, since the sampling pulse 23 and the trigger signal 51 are synchronized with one another, the fractional time measuring circuit 152 in FIG. 1 is unnecessary in the time difference detector 24. The sampling pulse generator 22 also provides delay data 23b to the variable delay element 52 and the address generator 36. The delay data 23b is added with a delay time $\Delta T$ every time the trigger pulse is received by the sampling pulse generator 22.

The time difference detector 24 receives the trigger signal 51 and the synchronous clock 53 from the DUT driver 40 and the sampling pulse 23 from the sampling pulse generator 22, and measures the time difference between the trigger signal 51 and the sampling pulse 23 coming immediately after the trigger signal 51. The time difference data 25 thus obtained is provided to the address generator 36 whereby the address data corresponding to the time difference data 25 is produced. In this case, as shown in FIG. 4, the time difference detector 24 has no fractional time measuring circuit such as shown in FIG. 1, since the trigger signal 51 and the sampling pulse 23 are synchronized with the synchronous clock 53.

The variable delay element 52 receives the sampling pulse 23 and the delay data 23b from the synchronous sampling pulse generator 22 and adds the delay time defined by the delay data 23b to the sampling pulse 23. The delay time is an integer multiple of a fractional time $\Delta T$ and is smaller than the period of the sampling pulse 23. The variable delay element 52 produces the sampling pulse 58c which is delayed by $\Delta T \times N$ where N is the order of the trigger pulse 51.

For example, for the sampling pulse 23 coming immediately after the first trigger signal 51, the fractional time $\Delta T$ is added thereto to produce the sampling pulse 58c. For the sampling pulse 23 coming immediately after the second trigger signal 51, the fractional time $\Delta T \times 2$ is added thereto to produce the sampling pulse 58c. In this manner, the timing of the sampling pulse 58c relative to the trigger signal 51 is shifted by $\Delta T$ from the previous timing. The fractional time $\Delta T$ corresponds to the difference of two adjacent addresses of the test result memory 80.

The time difference detector 24 measures the time difference between the trigger signal 51 and the sampling pulse 23 coming immediately after the trigger signal 51. The RS flip-flop 142 in FIG. 4 is set by the trigger signal 51 and is reset by the synchronous sampling pulse 23 coming immediately after the trigger signal to produce the time difference signal 143. The time difference signal 143 is provided to the flip-flop 144 to produce a clock synchronized time difference signal 145. The clock synchronized time difference signal 145 is provided to the counter 148 which counts the number of clock signal 53 produces the time difference data 25. When the trigger signal 51 and the sampling pulse 23 are synchronized with the clock 53 as noted above, the flop 144 may be unnecessary.

The address generator 36 receives the time difference data 25 from the time difference detector 24 and the delay data 23b from the synchronous sampling pulse generator 22 and produces address data 59b corresponding to the sum of data 25 and 23b. Suppose the time difference data 25 between first trigger signal 51 and the sampling pulse 58c immediately after the first trigger signal 51 is "L", the address data 59b corresponding to the time difference "L" is generated by the address generator 36. For the next sampling pulse 58c, the address data 59b corresponding to the sum of the time difference data 25 and the time interval T, i.e, L+T is generated. For the third sampling pulse 58c, the address data corresponding to the time L+2T is generated. In this manner, the address data 59b indicating the relationship L+NT will be generated for the sampling pulses 58c following the first trigger signal 51.

When the time difference data 25 between second trigger signal 51 and the sampling pulse 58c immediately after the second trigger signal 51 shows the same data "L" as above, the address data 59b corresponding to the time difference "L+ΔT" is generated by the address generator 36. This is because the delay data 23b in this situation shows the delay time ΔT. For the next sampling pulse 58c, the address data 59b corresponding to the sum of the time difference data 25 and the time interval T, i.e, L+ΔT+T is generated. For the third sampling pulse 58c, the address data corresponding to the time L+ΔT+2T is generated. In this manner, the address data 59b indicating the relationship L+ΔT+NT will be generated for the sampling pulses 58c following the second trigger signal 51.

Similarly, the address data 59b indicating the relationship L+2ΔT+NT will be generated for the sampling pulses 58c after the third trigger signal 51. By repeating this process, the measured data will be stored in each address of the memory 80.

In the above example, instead of adding the fractional delay time NΔT to the time difference between the trigger signal 51 and the sampling pulse 23, the delay element 52 may be controlled to produce a random delay time. Then, the timing of the sampling pulse 58 (charged particle beam 61) coming after the trigger signal 51 becomes random, which makes possible to obtain measured data for all of the timings relative to the trigger signal 51. This method of applying the random delay time to the delay element 52 can be used either in the synchronous or asynchronous relationship between the trigger signal and the sampling pulse.

According to the second embodiment of the present invention, the charged particle beam 61 is constantly generated by the synchronous sampling pulse 58c throughout the test. In other words, the charged particle beam column 60 does not involve the transition from the non-operation to operation as in the conventional technology using the burst sampling pulse. Therefore, the charged particle beam test system of the present invention can eliminate the voltage error during the transient period involved in the conventional technology of FIGS. 5–7.

Figure 9:
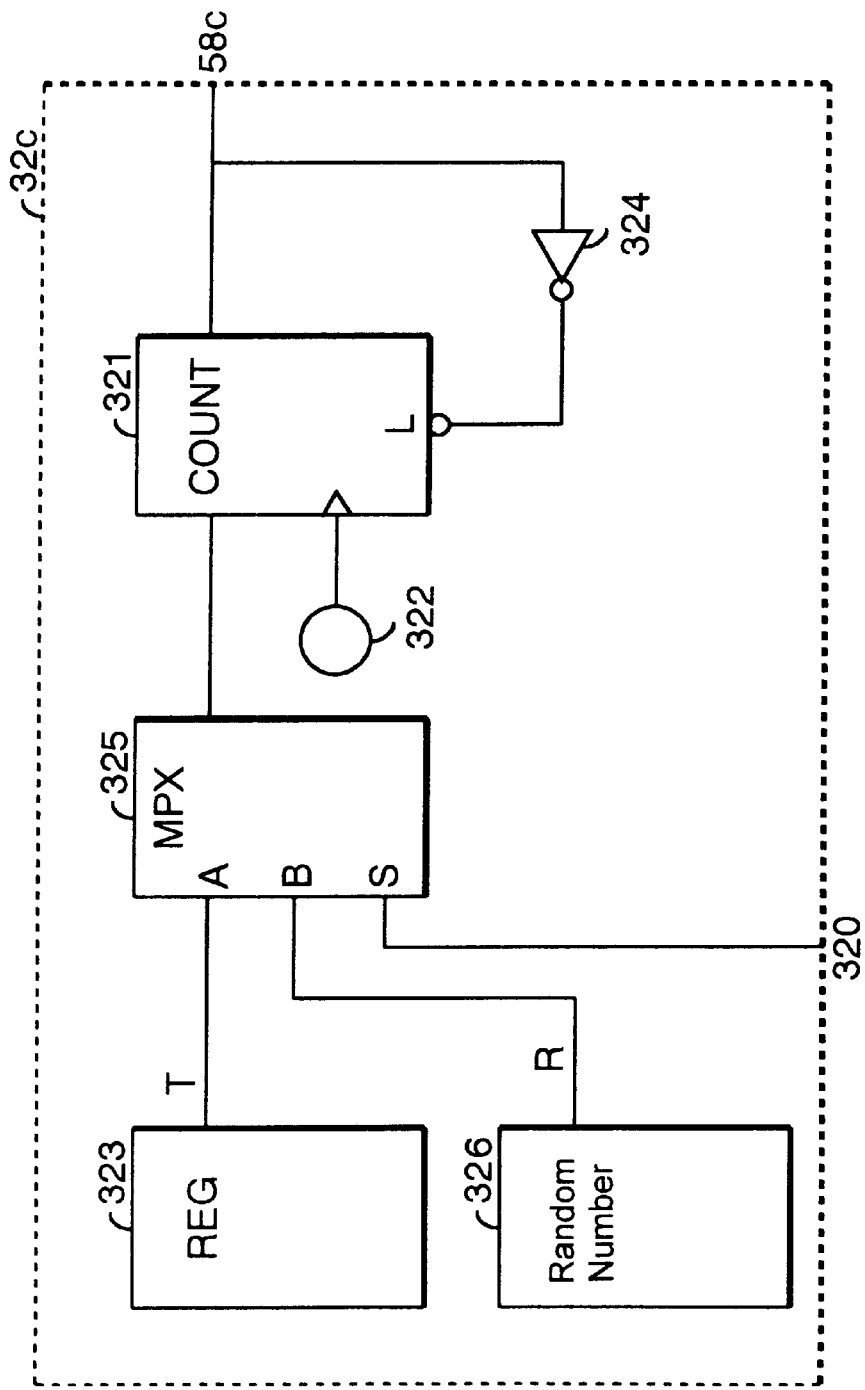
FIG. 9 is a block diagram showing another example of sampling pulse generator in the charged particle beam test system of the present invention.

The third embodiment of the present invention is described with reference to FIGS. 9 and 10. FIG. 9 is a schematic block diagram showing a structure of the sampling pulse generator to be used in the charged particle beam test system and FIG. 4 is a timing chart showing the timing relationship between the trigger signals and the continuous sampling pulses.

In the first embodiment of FIGS. 1 and 2, it is expected that the timing relationship between the trigger signal and the following sampling pulses is asynchronous to ultimately obtain measured data for all of the timings relative to the trigger signal. However, there is a possibility that the such an asynchronous relationship will be lost and thus the same address data for the memory 80 will be repeatedly generated. This is because the asynchronous relation is not completely guaranteed by the circuit configuration of FIG. 1. Therefore, in the case where there arises a fixed timing relationship, measured data with a variety of timings may not be stored in the test result memory 80.

The sampling signal generator of FIG. 9 is to assure the asynchronous relationship between the trigger signal and the sampling pulse. In this example, the sampling pulse generator 32c includes a register 323, a random number generator 326, a multiplexer 325, a counter 321, a clock generator 322, and a buffer 324. The register 323 provides data for specifying the time interval T of the sampling pulse to be generated by the sampling pulse generator 32c. The random number generator 326 generates random number R indicating the random time lengths. The outputs of the register 323 and the random number generator 326 are provided to the multiplexer 325 so that either one of them is supplied to the counter 321 by the multiplexer 325.

The multiplexer 325 also receives an end signal 320 which indicates the end of acquiring the measured data with respect to the group of sampling pulses following a certain trigger signal. In receiving the end signal 320, the multiplexer 325 selects the random number R from the random number generator 326 which is provided to the counter 321. Once the random number R is received by the counter 321, the multiplexer 325 selects the data from the register 323 indicating the time interval T until it receives the next end signal 320.

The counter 321 counts the number of clock pulses from the clock generator 322 until the counted number reaches the value specified by the data from the multiplexer 325. Thus, for the first sampling pulse after the trigger signal, the time difference therebetween is determined by the random number R while the following sampling pulses will be generated with the time interval T. Because the random data R varies in every cycle of the trigger pulse, such as R1, R2 and R3 in FIG. 11, the resultant time intervals $Tm_{21}$, $Tm_{22}$ and $Tm_{23}$ between the trigger pulses and the sampling pulses immediately after the trigger pulses vary in a random manner. Consequently, the measured data of various timings can be stored in the test result memory 80.

Although the charged particle beam test system in the foregoing examples include electron gun, other types of beam such as ion beam can also be used to test the secondary electron from the DUT.

According to the charged particle beam of the present invention, the charged particle beam is constantly applied to the DUT by the continuous sampling pulse throughout the test. The charged particle beam column does not involve the transition from the non-operation to operation. Therefore, the charged particle beam test system of the present invention can eliminate the voltage error during the transient stage involved in the conventional technology. Further, in the present invention, the charged particle beam test system can efficiently acquire the test results corresponding to the predetermined addresses of the test result memory with high timing resolution in a short period of time.

What is claimed is:

1. A charged particle beam test system for irradiating a charged particle beam upon predetermined portion of a device under test (DUT) and detecting secondary electron detected therefrom representing a voltage of the irradiated portion of said DUT, comprising:

a DUT driver for supplying a test signal to said DUT to cause said voltage at said irradiated portion and generating a trigger signal in synchronism with said test signal;

a sampling pulse generator for continuously generating a series of sampling pulses having a predetermined time interval to continuously drive said charged particle beam so that said secondary electron is emitted from said DUT in response to said sampling pulse;

a time difference detector for detecting a time difference between said trigger signal from said DUT driver and one of said sampling pulses coming immediately after said trigger signal;

an address data generator for generating address data corresponding to said time difference detected by said time difference detector; and a test result memory for storing measured data representing an amount of said secondary electron emitted from said irradiation portion of said DUT in addresses specified by said address data from said address generator;

wherein a timing relationship between said trigger signal and said sampling pulses is unknown before generating the sampling pulses and being detected by said time difference detector.

2. A charged particle beam test system as defined in claim 1, wherein said trigger signal generated by said DUT driver and said series of sampling pulses generated by said sampling pulse generator are asynchronous with one another and the time difference therebetween is unknown before generating the sampling pulses.

3. A charged particle beam test system as defined in claim 1, including a charged particle beam column having a charged particle beam generator for continuously generating a charged particle beam, a secondary electron detector for detecting said secondary electron from said DUT, and a beam blanker for blanking said charged particle beam in response to said sampling pulse to produce a pulsed beam to be irradiated on said DUT.

4. A charged particle beam test system as defined in claim 1, wherein said time difference detector includes a flip-flop which is driven by said trigger signal and said one of said sampling pulses, and a counter which counts clock pulses during a period defined by an output of said flip-flop to generate data representing said time difference.

5. A charged particle beam test system as defined in claim 1, wherein said time difference detector includes a flip-flop which is driven by said trigger signal and said one of said sampling pulses, a counter which counts the number of a clock signal during a period defined by an output of said flip-flop to generate data showing a time difference which is an integer multiple of a period of said clock signal, and a fractional time measuring circuit which measures a fraction of said time difference between said trigger signal and said one of said sampling pulses which is smaller than said period of said clock signal.

6. A charged particle beam test system as defined in claim 1, wherein said sampling pulse generator includes a random number generator for generating a random time length and a register indicating time interval data for generating a specified time interval so that a first sampling pulse coming immediately after said trigger signal is generated at a timing based on said random time length and sampling pulses following said first sampling pulse are generated at timings based on said specified time interval.

7. A charged particle beam test system as defined in claim 6, wherein said sampling pulse generator further includes a multiplexer to receive said random time length from said random number generator and said time interval data from said register to selectively provide either one of input data to a counter which counts a clock signal.

* * * * *